United States Patent [19]
Ito

[11] Patent Number: 5,730,799
[45] Date of Patent: Mar. 24, 1998

[54] DEVICE FOR PRODUCING SINGLE CRYSTALS

[75] Inventor: Makoto Ito, Kishimagun, Japan

[73] Assignee: Sumitomo Sitix Corporation, Amagasaki, Japan

[21] Appl. No.: 545,777

[22] PCT Filed: May 23, 1994

[86] PCT No.: PCT/JP94/00821

§ 371 Date: Nov. 27, 1995

§ 102(e) Date: Nov. 27, 1995

[87] PCT Pub. No.: WO94/28206

PCT Pub. Date: Dec. 8, 1994

[30] Foreign Application Priority Data

| May 31, 1993 | [JP] | Japan | 5-128795 |
| Feb. 17, 1994 | [JP] | Japan | 6-020073 |
| May 13, 1994 | [JP] | Japan | 6-100190 |

[51] Int. Cl.$^6$ ................................ C30B 35/00
[52] U.S. Cl. ........................ 117/217; 117/13; 117/208; 117/218
[58] Field of Search ................ 117/2, 13, 20, 117/208, 217, 218, 222

[56] References Cited

U.S. PATENT DOCUMENTS

| 5,004,519 | 4/1991 | Hariri | 117/217 |
| 5,264,189 | 11/1993 | Yamashita et al. | 117/217 |
| 5,363,796 | 11/1994 | Kobayashi et al. | 117/217 |
| 5,441,014 | 8/1995 | Tomioka et al. | 117/213 |
| 5,450,814 | 9/1995 | Shimishi et al. | 117/213 |
| 5,476,065 | 12/1995 | Ikezawa et al. | 117/218 |

FOREIGN PATENT DOCUMENTS

| 62-216990 | 9/1987 | Japan . |
| 1-072984 | 3/1989 | Japan . |
| 1-100086 | 4/1989 | Japan . |
| 4-219386 | 8/1992 | Japan . |
| 5-294784 | 11/1993 | Japan | 117/217 |
| 6-219886 | 8/1994 | Japan . |
| 2139918 | 11/1984 | United Kingdom | 117/217 |

*Primary Examiner*—R. Bruce Breneman
*Assistant Examiner*—Felisa Garrett
*Attorney, Agent, or Firm*—Armstrong,Westerman,Hattori,McLeland & Naughton

[57] ABSTRACT

A device for producing single crystals has been presented which enables the pulling up and growing of single crystals. Without loss of accurate control of the oxygen concentration in the crystal, and with excellent dielectric strength of subsequently produced gate oxide films. A heat resistant and heat insulating component (7) of cylindrical or cylinder-like form surrounding the pulling up zone of the single crystal is suspended from the ceiling (6a) or the upper part of the wall of the metallic vessel (6) with a gap ($h_1$) from the ceiling to divide the inert gas (30) supplied from above into inert gas flows (33 and 32) outside and inside this component.

4 Claims, 5 Drawing Sheets

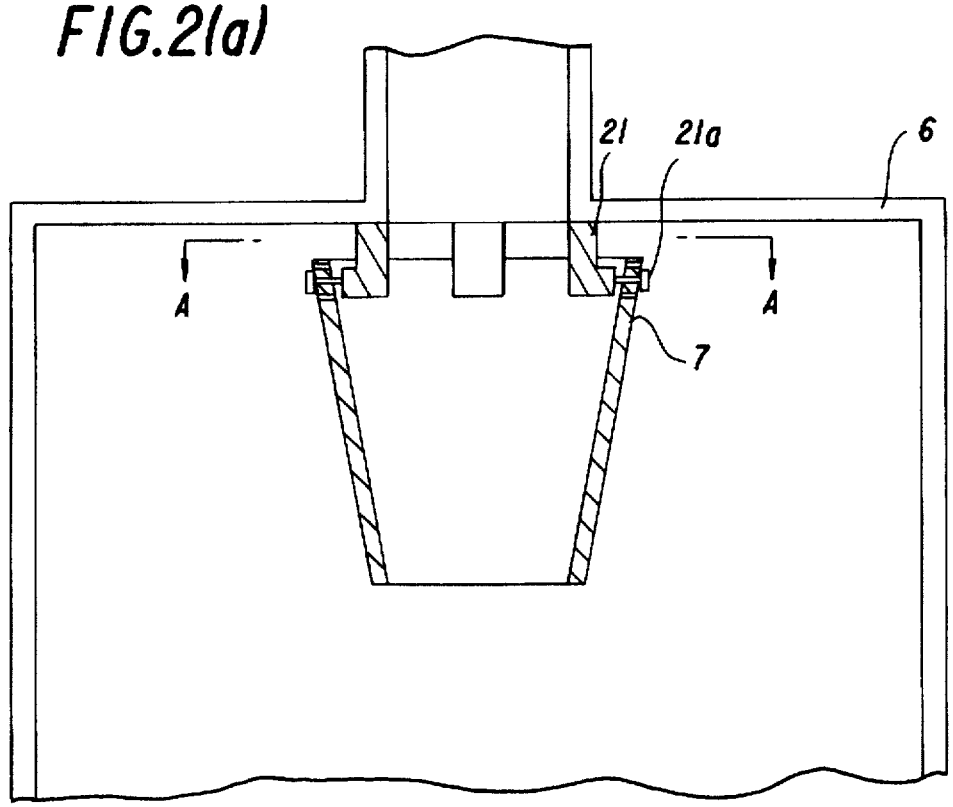
FIG.2(a)
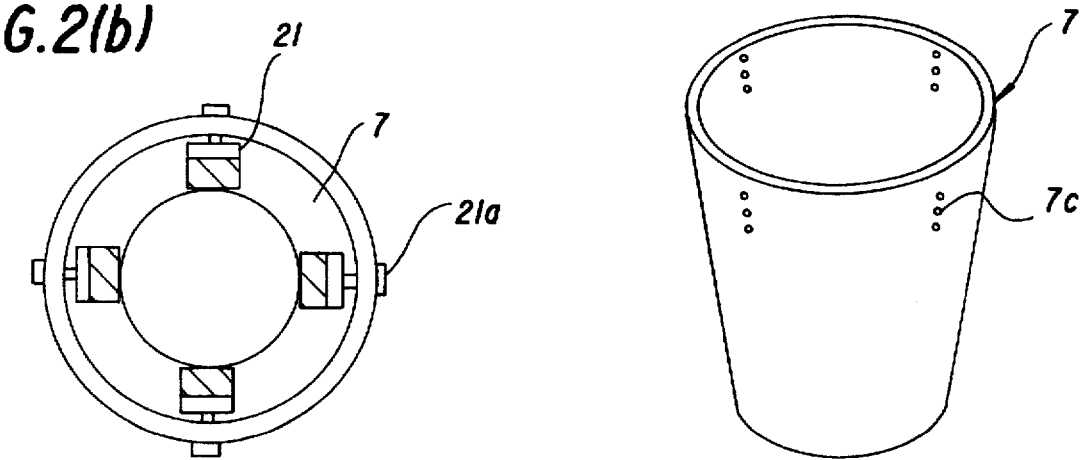
FIG.2(b)
FIG.2(c)

DEVICE FOR PRODUCING SINGLE CRYSTALS

TECHNICAL FIELD

The present invention relates to a device and a process for producing single crystals of silicon (and similar materials) having little contamination or thermal oxidation induced stacking faults, thus enabling the production of wafers whose gate oxide films have excellent dielectric strength. This device and process are also suited for finely controlling the oxygen content of the pulled crystal.

BACKGROUND ART

Single crystals that are produced in according to the Czochralski process contain appreciable amount of oxygen, which has been melted out of the quartz ($SiO_2$) crucible, as the silicon melt reacts with the quartz crucible. consequently, during repetitive heat treatment which occurs in the IC and LSI manufacturing processes, this oxygen tends to prevent the occurrence of slips and burrs. Furthermore, during the heat treatments at a temperature of approximately 1000° C., oxide precipitates in the crystal aggregate to form stacking faults of high density and reduce the impurities in the surface layers of wafers cut from the crystal (a phenomenon known as intrinsic gettering).

FIG. 6 schematically illustrates a cross section of a current device and the pulling-process according to the Czochralski technique. The crucible 1 is comprised of a quartz vessel 1a on the inside and a graphite vessel 1b on the outside. A heating element 2 is mounted outside the crucible 1, in which the melt 5, the charge material for the crystal melted by the heating element, is contained. A seed crystal 3 is lowered until it makes contact with the surface of the melt 5 and then is pulled upward to grow a crystal at its lower end. These parts and components are contained in a metallic vessel provided with a water cooling device, all of which constitutes a whole device for producing single crystals.

During the course of the single crystal pulling process, inert gas (such as argon gas) of high purity is introduced into the metallic vessel 6 from above at the center, forming a gas flow 30. The gas flow 30 turns into a gas flow 31 containing both silicon monoxide (SiO) that has evaporated from the surface of the silicon melt 5 and carbon monoxide (CO) generated as a result of the silicon monoxide reacting at high temperatures with the graphite components such as the heating element 2, the graphite vessel 1b, etc. The gas flow 31 flows down along the outside and the inside of the heating element 2 to be discharged through the discharge ports 8.

Since the argon gas flow 31 in the metallic vessel 6 is turbulent and locally stagnant, silicon monoxide is deposited on the ceiling of the vessel 6 layer by layer or in particle forms. Fine particles or small blocks of the deposited silicon monoxide fall onto the surface of the melt 5, are incorporated in the boundary layer of the growing crystal and give rise to dislocations in crystal.

Another problem is that, the silicon melt is contaminated also, unless carbon monoxide is properly discharged. That is, the carbon monoxide incorporates into the single crystal, will induce lattice defects in the single crystal.

In order to effectively obviate these problems, two devices mentioned below has been proposed.

FIG. 4 illustrates schematically a pulling assembly (the first device) proposed by the U.S. Pat. No. 4,330,362: Kokoku No. 57-40119. This device is characterized by having an upper flat annular rim 7a projecting beyond the crucible edge and a joining piece 7b attached to this annular rim 7a and extending downwardly and cortically from its inner edge, the joining piece 7b being 0.2 to 1.2 times as high as the crucible 1.

FIG. 5. illustrates schematically another pulling assembly (the second device) disclosed in Kokai No. 64-72984. This device is characterized by having a heat resistant and heat insulating cylinder 10 that extends downward coaxially surrounding the single crystal 4 being pulled and is tightly joined to the subvessel 6c at its junction with the metallic vessel 6. The device is also characterized by having a heat resistant and heat insulating annular plate 11, which closely rests on the upper end of the heat insulating component 12 and has an outside diameter nearly identical with that of the heat insulating component 12, the inside diameter of which tightly fits the above mentioned heat resistant and heat insulating cylinder 10.

The first and the second devices as mentioned above effectively increase the pulling rate by shielding the crystal pulled from heat irradiation and they prevent fine particles of silicon monoxide from falling into the melt, and suppress generation of the thermal oxidation induced stacking faults (OSF). However, these devices do not solve the problems of enhancing the dielectric strength of the oxide films of the wafers which are cut from the crystal. And without improved the dielectric strength, it is impossible to produce small highly integrated semiconductor. In addition, these devices can not solve the problem of having an adverse effect on controlling the oxygen concentration in the crystal.

The exact mechanism of formation of faults, which that deteriorate the dielectric strength of the oxide films has not yet been clarified. It has been reported that the cores of faults in crystals, which constitute the origin of the defects in the dielectric strength of the oxide films are formed during the crystal growth, the cores being contracting at the high temperature stage (above 1250° C.) and grown at the low temperature stage (below 1100° C.) (See 30P-ZD-17. The Japan Society of Applied Physics Extended Abstracts, The 39th Spring Meeting, 1992). In short, the dielectric strength of the oxide films are known to depend on the thermal history immediately after crystal pulling.

In the first device as schematically illustrated in FIG. 4, the internal clearance of the circular truncated cone 7b located surrounding the crystal being pulled is as low as 0.2 to 1.2 times that of the crucible. Thus immediately after crystal grows it is exposed to the low temperature atmosphere in the metallic vessel, and is cooled too rapidly to facilitate shrinkage of the defect cores. As the result the dielectric strength of the oxide films deposited on the wafers cut from the crystal is deteriorated.

In the second device as schematically illustrated in FIG. 5, since the heat resistant and heat insulating cylinder 10 is tightly joined to the water cooled metallic vessel 6 and the subvessel 6c at their junction, the internal surface of the heat resistant and heat insulating cylinder 10 is cooled by thermal conduction, a rapid cooling takes place at the high temperature stage immediately after crystal growing. Hence, immediately after the crystal grows only a slight shrinkage of the defect clusters occurs and as a result the dielectric strength of the oxide films are deteriorated.

While the oxygen concentration in the single crystal is required to be brought under control to the accuracy of $\pm 0.75 \times 10^{17}$ atoms/$cm^3$ from the target value in order to effectively carry out gettering action about oxygen in the single crystals as mentioned before, it is strongly influenced by the state of the above mentioned argon gas flow.

The flow velocity of the argon gas (Vg) depends on the gas supply pressure (Pg), the gas flow rate (Qg), the gas passage cross section (Ag) and the internal furnace pressure (Pf). This relationship can be described by the formula (A) given below.

$$Vg=(Qg/Ag)\times(Pg/Pf) \quad (A)$$

This gas flow velocity (Vg) significantly influences the contamination of the single crystals by the silicon monoxide that evaporates from the surface of the melt.

Since in the first device illustrated in FIG. 4, the circular truncated cone 7b, the flat annular rim 7a, and the circular cylinder 18 are tightly connected to each other, the entire argon gas flow from the upper side of the pulling chamber forms a gas flow 31 that passes inside the joining piece 7b to the narrow gap between the bottom portion of the joining piece 7b and the surface of the melt 5, after which it flows downward along the inside and the outside surfaces of the heater 2.

Since, as mentioned before, the argon gas flow from the pulling chamber is turbulent, the influence of the upward flow of the silicon monoxide that evaporates from the surface of the melt 5 upon the argon gas flow is not uniform along the circumference of the joining piece 7b. Hence the outward flow of the argon gas at the lower end of the joining piece 7b is not circumferentially uniform, rather there is variation in the velocity of the the argon gas flow (Vg) between the lower end of the joining piece 7b and the surface of the melt 5 depending on the location along the circumference of the joining piece 7b.

When, in the first device shown in FIG. 4, the argon gas flow rate (Qg) is enhanced and the gas flow velocity (Vg) is increased, sufficient discharge of the silicon monoxide and the carbon monoxide can be obtained, thus preventing them from contaminating. However, since, the flow velocity (Vg) in the gap between the end of the joining piece 7b and the surface of the melt 5 subsequently increases, the local variation of the flow velocity increases, depending on the circumferential position. And variation in the surface temperature and the convection in the melt 5 is induced, making it difficult to control the oxygen concentration in the crystal within a certain range with desirable accuracy and reproducibility.

As the flow velocity (Vg) in the gap between the lower end of the joining piece 7b and the surface of the melt 5 increases, the surface of the melt 5 tends to vibrate, leading to a situation where it is impracticable to carry out drawing a dislocation free single crystal.

On the other hand, when the argon gas flow rate (Qg) is reduced and the gas flow velocity (Vg) is lowered, the variation in the flow velocity (Vg) in the gap between the lower end of the joining piece 7b and the surface of the melt 5 decreases, hence control over the oxygen concentration is improved. However, decrease in the gas flow velocity (Vg) entails a certain loss in capability to discharge silicon monoxide and carbon monoxide, raising the problem of contamination of the silicon melt 5 by silicon monoxide and carbon monoxide particles.

The problem mentioned above exists not only with the first device but also with the second device illustrated in FIG. 5, and is a problem common to existing devices. In short, with existing devices there are difficulties in providing the dielectric strength of the oxide films for the highly integrated micro-semiconductor or in accurately controlling the oxygen concentration in the crystal.

DISCLOSURE OF THE INVENTION

The present invention aims to provide a device and a process that enables production of single crystals from which wafers whose oxide films are superior in the dielectric strength can be produce. This is accomplished by a pulling up technique by which an adequate temperature distribution in the direction of withdrawing the single crystal is formed, contamination of the single crystal is avoided, and the accurate control of the oxygen concentration in the single crystal is maintained.

The aims of this invention are achieved by providing (1) the device for producing single crystals of silicon as described below and (2) the method as described below for producing single crystals by the use of this device.

(1) FIG. 1 illustrates the device for producing the single crystals. The device is characterized by and comprising: the crucible 1 which contains the melt 5, of the charge material for the single crystal to be grown, the heating element 2 to heat the melt 5, the withdrawing measure 9 to grow the single crystal 4 after bringing the seed crystal 3 into contact with the melt 5, and a metallic vessel 6 which contains all of the constituents described above, wherein there are arranged a heat resistant and heat insulating component 7 in a cylinder form or in a conical form with the diameter being narrowed gradually in the top to bottom direction, the component surrounding the periphery of the zone of pulling up the single crystal, and supporting means 21, 22 of the heat resistant and heat insulating component, being capable of adjusting the gap $h_1$ between the upper top of the component 7 and the ceiling part 6a of the metallic chamber 6, through which gap h1 inert gas supplied from the upper part of the metallic chamber 6 can be branched into inert gas 33 flowing down inside the component 7 and inert gas 32 flowing down outside the component 7.

(2). A method for producing a single crystal, using a device for producing a single crystal, the device comprising crucible 1 for placing melt 5 of the raw materials of the single crystal to be grown, heating means 2 for heating the melt 5, pulling-up means 9 for growing the single crystal by making seed crystal 3 in contact to the surface of the melt 5 in the crucible 1, and metallic chamber 6 For placing the individual means, wherein a heat resistant and heat insulating component 7 in a cylinder form or in a conical form with the diameter being narrowed gradually in the top to bottom direction, is placed above the melt in the crucible by means of height-adjustable supporting means 21, 22 of the heat resistant and heat insulating means, and gap $h_1$ is arranged between the upper top of the component 7 and the ceiling part 6a of the metallic chamber 6, through which gap $h_1$ inert gas supplied from the upper part of the metallic chamber 6 can be branched into inert gas 33 flowing down inside the component 7 and inert gas 32 flowing down outside the component 7 to subsequently meet the branched flows of the inert gas together.

Preferably, the heat resistant and heat insulating component 7 described above in (1) and (2) is made of graphite, having the surface thereof coated with silicon carbide. The gap $h_1$ between the upper top of the component 7 and the ceiling part 6a of the metallic chamber 6 can be adjusted within a range of 5 mm to 100 mm, so as to adjust the flow, namely the flow rate of the inert gas flowing into the gap. The gap $h_1$ is adjusted by means of the supporting means 21, 22 of the heat resistant and heat insulating component placed on the ceiling part of the metallic chamber.

BRIEF DESCRIPTION OF THE DRAWINGS

FIG. 2 is an illustration of an example of one way to support the heat resistant and heat insulating part; (a) being a side view section, (b) being a top view, and (c) being a bird's-eye view from the top and to one side;

BEST MODE FOR CARRYING OUT THE INVENTION

The device and the process in accordance with this invention are explained referring to figures below.

Figure 1A:
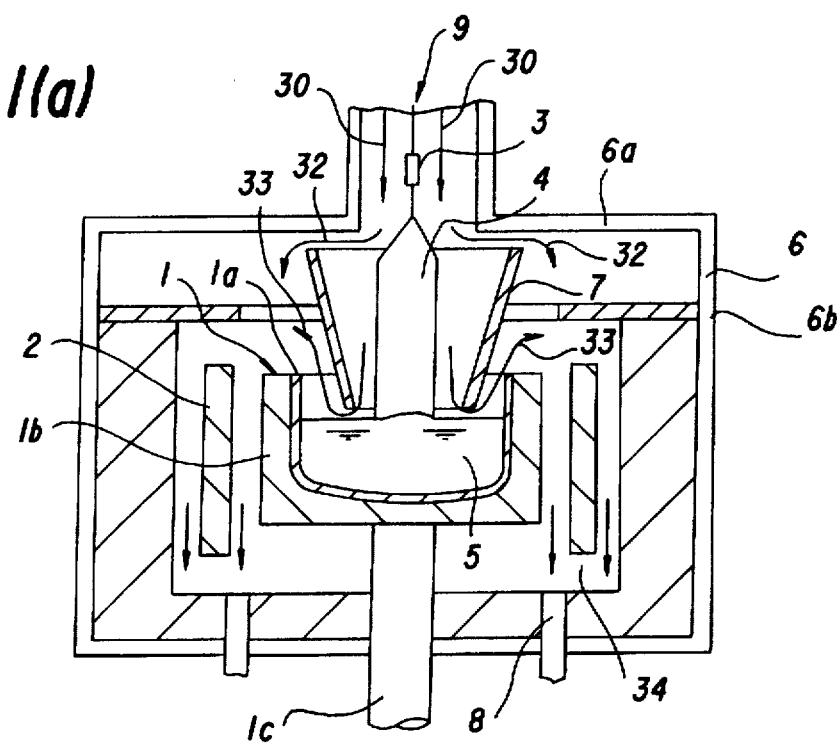
FIG. 1 is an illustration of the device in accordance with the present invention; (a) showing a cross sectional view of the device.

FIG. 1 is an illustration of the device in accordance with this invention, (a) showing a cross section of the device, and (b) showing an enlarged view of the key portion. The crucible 1 is illustrated in FIG. 1(a), and consists of a dual structure in which the inside is a quartz vessel 1a, and the outside is a graphite vessel 1b which are placed on the crucible supporting shaft 1c. This crucible supporting shaft 1c is made in such way that it may be rotated and raised or lowered in addition to supporting the crucible.

In FIG. 1, the metallic vessel 6 provided with a water cooling device, is a cylindrical vacuum chamber consisting of the ceiling 6a and the side wall 6b provided with a shaft for withdrawing of a single crystal aligned with the center line, the crucible 1 being positioned in its middle and surrounded by a heater 2. Above the crucible 1, a withdrawing measure 9 that can be turned around and raised or lowered is suspended from the center of the ceiling 6a of the metallic vessel, and a seed crystal 3 is placed at its lower end. The seed crystal 3 is pulled up as it is turned around by the withdrawing measure 9, and a single crystal 4 is grown at its lower tip where it makes contact with the melt 5.

Figure 1B:
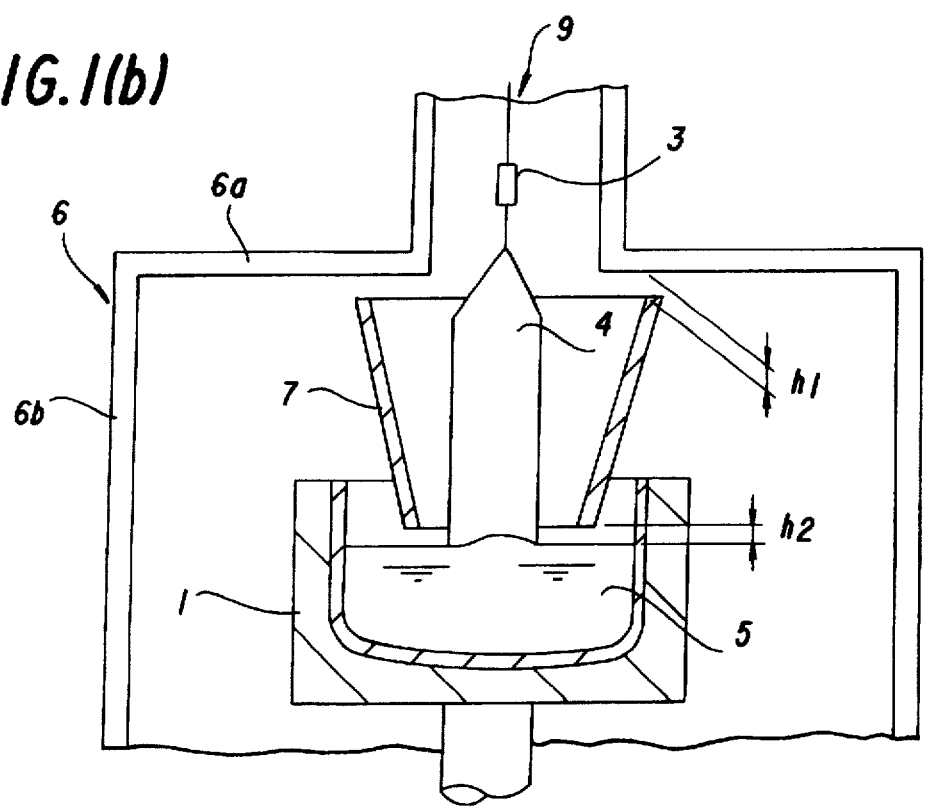

As is illustrated in FIG. 1(b), heat insulating component 7 in a conical shape is sustained, coaxially with the pulling-up means 9, in the periphery of the zone of pulling up the single crystal, in a manner such that the component 7 might not be in contact to the ceiling part 6a of the metallic chamber 6 while keeping gap h1 between the upper top of the heat resistant and heat insulating component 7 and the ceiling part 6a in order that the inert gas, namely argon gas, can flow through the gap while keeping gap $h_2$ from the surface of the melt 5.

FIG. 2 depicts a view wherein the heat resistant and heat insulating component 7 is sustained by means of supporting member 21 as one embodiment of the supporting means of the heat resistant and heat insulating means. FIG. 2(a) depicts a longitudinal cross section of the sustaining state by means of the supporting member 21: FIG. 2(b) depicts a horizontal cross section in a top view line A—A. Furthermore, FIG. 2(c) depicts a perspective view of the heat resistant and heat insulating component 7. In this embodiment, four square bars as the supporting member 21 are mounted at an interval of 90° angle on the ceiling part 6a of the metallic chamber 6, and the upper top of the heat resistant and heat insulating component 7 is held tightly by means of the supporting member 21 and tying bolts 21a. The heat resistant and heat insulating component 7 is thereby sustained, so that the upper top of the heat resistant and heat insulating component 7 might not come into contact to the ceiling part 6a while keeping the gap for argon gas to be branched and subsequently flow downward inside and outside the heat resistant and heat insulating component 7. The number of the supporting member 21 is not limited to the aforementioned numerical figure 4: the shape thereof is not limited to a square bar shape.

As shown in FIG. 2(c), a plurality of sustaining through-holes 7c for receiving the bolts 21a are arranged on the upper top part of the heat resistant and heat insulating component 7. This is because by selecting appropriate through-holes for sustaining, the gap (the aforementioned "$h_1$") between the upper top of the heat resistant and heat insulating component 7 and the ceiling part 6a can be adjusted. Thus, the adjusting means is not limited to the means illustrated.

Figure 3A:
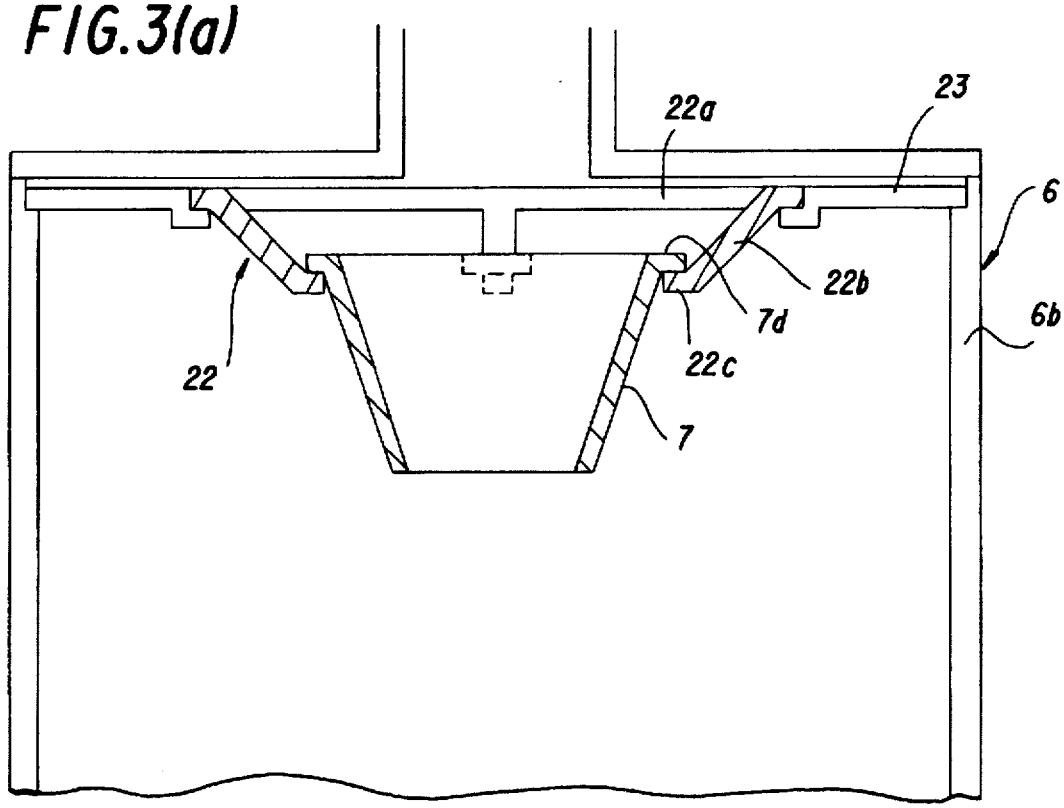
FIG. 3 is an illustration of another example of a way to support the heat resistant and heat insulating component; (a) being a side view section, (b) being a bird's-eye view of the supporting legs, and (c) being a bird's-eye view of the heat resistant and heat insulating component supported by the supporting legs.
Figure 3B:
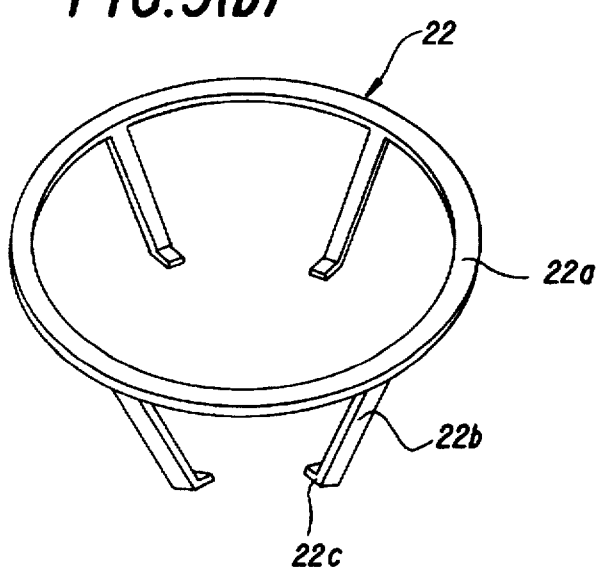
Figure 3C:
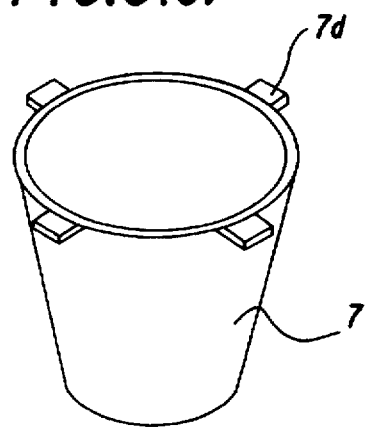

FIG. 3 depicts a view where the heat resistant and heat insulating means 7 is sustained by means of supporting leg member 22 as another embodiment of the supporting means of the heat resistant and heat insulating means: the heat resistant and heat insulating means 7 is mounted on the upper part of the side wall 6b of the metallic chamber 6. FIG. 3(a) depicts a longitudinal cross section of the supporting state by means of the supporting leg member 22; FIG. 3 (b) depicts a bird's-eye view of the supporting leg 22, wherein the supporting leg member 22 is composed of the upper end ring 22a and four sets of supporting leg 22b mounted thereon and end tips 22c. Further, FIG. 3(c) depicts a bird's-eye view of the heat resistant and heat insulating component 7 supported by means of the supporting leg member 22, wherein protrusions are placed at 4 positions along the circumference of the upper top face thereof.

In this embodiment, the supporting leg member 22 is held by setting the upper end ring 22a of the supporting leg member 22 into a retaining ring 23 arranged on the upper part of the side wall 6b of the metallic chamber 6. By subsequently hooking the protrusions 7d of the heat resistant and heat insulating component 7 onto the end tips 22c of the supporting leg member 22, the heat resistant and heat insulating component 7 is sustained in position at a distance from the ceiling part 6a. Additionally, the gap ($h_1$) between the upper top of the heat resistant and heat insulating component 7 and the ceiling part 6a is adjusted by the adjustment of the length and angle of the supporting leg 22b of the supporting leg member 22. As in FIG. 2, the shape of the supporting leg member 22 and the number of the supporting leg 22b are not limited to those illustrated.

As apparently shown in FIGS. 2 and 8, the structure of the supporting means should be the one which does not close the gap between the upper top of the heat resistant and heat insulating component 7 and the ceiling part 6a. The gap between the upper top of the heat resistant and heat insulating component 7 and the ceiling part 6a is arranged so as to branch the argon gas flow fed from the upper part of the metallic chamber 6 into the downward flow in the inside region of the heat resistant and heat insulating component 7 and the downward flow in the outside region of the heat resistant and heat insulating component 7. By supporting the heat resistant and heat insulating component 7 via the ceiling part 6a and side wall 6b of the metallic chamber 6 by using such supporting means, the objective of the present invention can be attained.

In any of the embodiments, the heat resistant and heat insulating component 7 should be made of graphite, and the shape should he in the form of a cylinder or a conical form with the diameter being narrowed gradually in the top to bottom direction, and preferably, the surface thereof is coated with silicon carbide. The reason why the heat resistant and heat insulating component 7 should be made of graphite is because the pull-up crystal can be made with high purity, and with a smaller risk of contaminating the crystal due to heavy metals. When the surface is coated with silicon carbide, furthermore, gas discharge from the air holes of the graphite component is prevented, also preventing the reaction of silicon monoxide vaporized from the surface of the melt 5 with the graphite component.

In order to produce a single crystal of good dielectric strength of the oxide films, it is necessary to adequately control the cooling rate in the pulled-up crystal, in particular to have adequate control of the cooling rate of crystal at the high temperature stage immediately after growing the crystal. Therefore, in the device and the process in accordance with this invention the heat resistant and heat insulating component 7 is extended in a wide range around the withdrawing range from the surface of the melt 5 in the crucible to the ceiling 6a of the metallic vessel 6. In addition the heat resistant and heat insulating component 7 is installed with an adequate gap between itself and the ceiling 6a of the water cooled metallic vessel 6 and is not tightly jointed to the ceiling.

Figure 4:
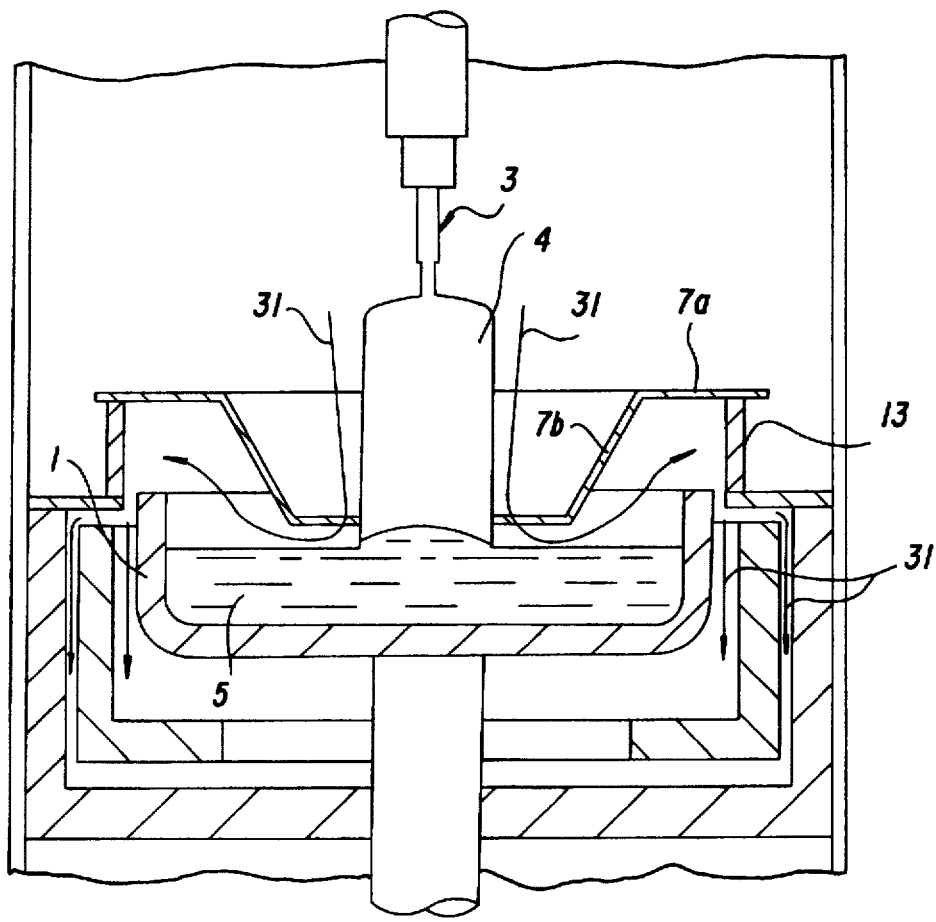
FIG. 4 is a side view section of an example of a conventional device for producing single crystals.

Compared with the low internal height of the connection 7b as in the device shown in FIG. 4, as a result of this structure, immediately after crystal growing the crystal is not directly exposed to the low temperature atmosphere.

Figure 5:
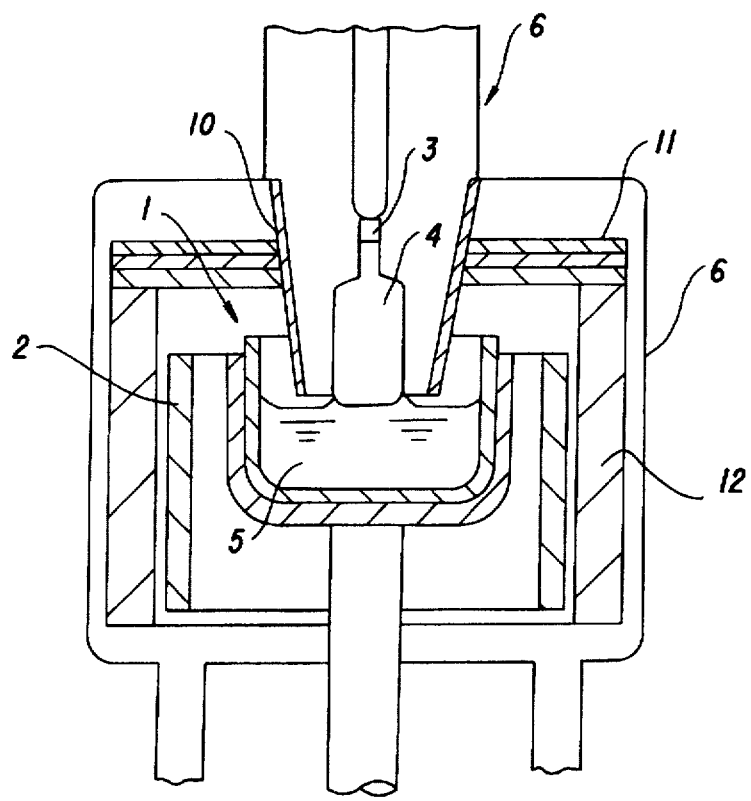
FIG. 5 is a side view section of another example of a conventional device for producing single crystals.
Figure 6:
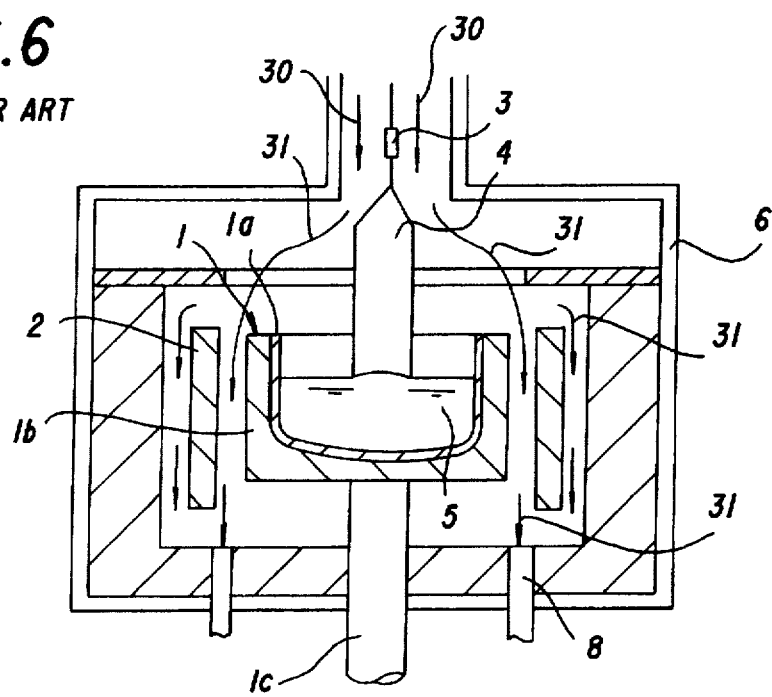
FIG. 6 is a schematic cross section illustrating a device and process for producing a single crystal in accordance with the Czochralski process.

Compared with the device illustrated in FIG. 5 where the heat resistant and heat resistant and heat insulating component 10 is closely connected to the ceiling of the metallic vessel 6, temperature decrease due to thermal conduction is prevented, therefore the inside surface of the heat resistant and heat insulating component 7 also can be maintained at higher temperature. Hence the device and the process in accordance with this invention enable reduction of the cooling rate immediately after crystal growing, to cool the single crystal slowly at the high temperature stage above 1100° C., and to improve the dielectric strength of subsequently produce gate oxide films.

As is illustrated in FIG. 1(a), the flow of argon gas 30 supplied from the upper part of the metallic vessel 6 is divided into a gas flow 33 flowing down inside the heat resistant and heat insulating component 7 and into another gas flow 32 flowing down outside the heat resistant and heat insulating component 7 out of the gap between the upper end of the heat resistant and heat insulating component 7 and the ceiling 6a. The divided gas flow 32 and 33 rejoin to form a gas flow 34 which flows between the crucible 1 and the heater 2 and outside the heater 2 to be discharged along with silicon monoxide and carbon monoxide through the discharge port 8. Therefore, ever if the gas flow velocity is reduced by diminishing the rate of gas flow 33 in order to limit the local difference in the flow velocity generated in the argon flow between the lower end of the heat resistant and heat insulating component 7 and the surface of the melt 5, the flow velocity beyond a certain value for the confluence of gas 34 toward the discharge port 8 can be secured, as long as a sufficient rate of the downward gas flow 32 outside the heat resistant and heat insulating component 7 is maintained. Consequently both, the oxygen concentration in the crystal can be controlled with high degree of accuracy and the silicon monoxide and carbon monoxide can be adequately discharged.

The gap ($h_1$) between the upper edge of the heat resistant and heat insulating component 7 and the ceiling 6a is preferably set in the range front 5 mm to 100 mm. For $h_1$ less than 5 mm the gas flow 33 becomes dominant and the local variation in the flow of the argon gas between the lower end of the heat resistant and heat insulating component 7 and the surface of the melt 5 increases, generating variation in the surface temperature of the melt 5 and the convection of the melt 5, thus making it hard to precisely control the oxygen concentration in the crystal. For $h_1$ larger than 100 mm on the other hand, influenced by the water cooled metallic vessel 6, the cooling rate of the pulled-up crystal 4 is too rapid and the dielectric strength of subsequently produce gate oxide films deteriorates. Furthermore, the desirable setting for $h_1$ is less than 30 mm. With $h_1$ greater 30 mm, the gas flow 33 flowing to the discharge port 8 becomes reversed or stagnant, and a part of the evaporated silicon monoxide is deposited in the metallic vessel 6 where it might fall into the melt 5.

The gap ($h_2$) between the lower edge of the heat resistant and heat insulating component 7 and the surface of the melt 5 is preferably between 10 mm and 50 mm. For $h_2$ larger than 50 mm, the crystal pulling rate has to be reduced, because the influence upon the crystal of the thermal radiation from the heater and the melt becomes excessive. With $h_2$ in the range between 10 and 50 mm, the flow of argon gas between the lower edge of the heat resistant and heat insulating component 7 and the surface of the melt 5 is uniform, and also the heat insulating effect upon the pulled crystal is secured.

As mentioned above, it is essential to minimize the local fluctuation in the velocity of the argon gas flow above the surface of the melt 5 in order to accurately control the oxygen concentration in the crystal within $\pm 0.75 \times 10^{17}$ atoms/cm$^8$. Continuous control of the gas flow velocity is realized by adjusting the gap $h_1$ between the upper end of the heat resistant and heat insulating component 7 and the ceiling 6a and by adjusting the gap $h_2$ between the lower end of the heat resistant and heat insulating component 7 and the surface of the melt 5.

Prior to processing a single crystal in the device in accordance with this invention, first the gaps $h_1$ and $h_2$ are to be set to deliver the appropriate flow velocity and rate of flow, depending on the dimensions, the pulling rate the required oxygen concentration in the crystal and other process conditions, and then the production of the single crystal is to be carried out.

A preferable embodiment of this invention is described above. In the paragraphs below the effects of this invention are described.

In a manufacturing device assembled in accordance with this invention as illustrated in FIG. 1(a) and (b), the heat resistant and heat insulating component 7 is made of a circular truncated cone with a height of 380 mm, an inside diameter of 400 mm at the upper end, an inside diameter of 200 mm at the lower end, and a thickness of 10 mm. In FIG. 2(a) the upper end of the heat resistant and heat insulating component 7 and the ceiling 6a of the metallic vessel 6 are separated by a gap $h_1$ of 10 mm, and the lower end of the heat resistant and heat insulating component 7 and the surface of the melt 5 are separated by a gap $h_2$ of 30 mm supported with the supporting legs 21 nearly concentrically with the withdrawing shaft 9 of the single crystal.

The material of the heat resistant and heat insulating component 7 was graphite and its surface was coated with silicon carbide.

The pulled up crystals 4 were silicon single crystals 6 inches in diameter, the silica crucible 1a used was 406 mm (16 inches) in diameter, the rate of argon gas flow into the metallic vessel 6 was set at 60 liter/min. the rate of pulling up was 1.1 mm/min. and the length of the pulled crystals was 1200 mm. For the purpose of comparison, other sample crystals were pulled up in the device illustrated in FIG. 4 (the first device) under the same conditions.

The single crystal products were evaluated in terms of; the yield ratio of dislocation free single crystals; the OSF acceptance ratio; the dielectric strength of gate oxide films acceptance ratio; and the oxygen concentration acceptance ratio. In this demonstration the yield ratio of the dislocation-free single crystals was represented by the ratio of the weight of the dislocation-free single crystal after excision of the portion with dislocation, to the weight of the original charged polycrystalline material.

The OSF acceptance ratio was represented by the ratio of the number of wafers of acceptable OSF to the total numbers of wafers, with the criteria of acceptance to be less than the standard number of OSF defects (10 defects/cm$^3$) after cutting silicon wafers out, and putting them through heat treatment of 780° C. for 3 Hr. and 1000° C. for 16 Hr. followed by selective etching. The acceptance ratio of the dielectric strength of gate oxide films was evaluated in terms of the voltage ramping procedure with a gate electrode consisting of phosphorus (P)-doped polycrystalline silicon with a 250 Å thick dry oxide film and an area of 8 mm$^2$. The criteria for acceptance was to withstand dielectric strength above the standard value (8 MV/cm of the mean electric field) before an avalanche. The result was represented by the ratio or the number of acceptable wafers to the total number of wafers tested.

In addition, single crystals pulled up free from dislocation and with oxygen content within ±0.75×10$^{17}$ atoms/cm$^3$ were determined to be of acceptable oxygen content, and the ratio of acceptance is represented by the ratio of the weight of the single crystals of acceptable oxygen content to the weight of dislocation free single crystals.

For these tests, a total of 34 crystals ware pulled up using this invention and, for comparison, the device illustrated in FIG. 4 (the first device). The results of above tests are shown in Table 1:

TABLE 1

| Test Items | Results in Acceptance with This Invention | Results by Tests for Comparison |
|---|---|---|
| Yield Ratio, Dislocation Free Single Crystals | 78.3% | 77.8% |
| OSF Acceptance Ratio | 98.6% | 92.1% |
| Acceptance Ratio, Dielectric Strength of Gate Oxide Films | 86.5% | 51.8% |
| Acceptance Ratio, Oxygen Content | 96.0% | 83.9% |

It can be seen that, all the test results for single crystals prepared with the device and by the process in accordance with this invention demonstrate better characteristics than those of the products for comparison, and a particularly remarkable difference can be seen in the acceptance ratio of the dielectric strength of gate oxide films.

APPLICABILITY FOR INDUSTRIAL USE

In accordance with this invention, it is possible to both divide and to control confluence of the gas flow, furthermore it is possible to control the cooling rate of the crystal in the direction of withdrawing the single crystal.

By these means intrusion of contaminants into the single crystal can be prevented and improvement of dielectric strength of the gate oxide films produced from the single crystal as well as precise control of the oxygen concentration in the crystal can be attained. Therefore this invention is applicable in metal fabrication and semiconductor industries as a device and a process for producing single crystals.

What is claimed is:

1. A device for producing a single crystal, comprising:
   a crucible for placing a melt of raw materials of a single crystal to be grown;
   heating means for heating the melt;
   pulling-up means for growing the single crystal by placing a seed crystal in contact to the surface of the melt in the crucible;
   and a metallic chamber for placing said individual means, wherein there are arranged a heat resistant and heat insulating component in a cylinder form or in a conical form with the diameter being narrowed gradually from the top to bottom direction, a component surrounding the periphery of a zone of pulling up the crystal, and supporting means of the heat resistant and heat insulating means, being capable of adjusting a gap between an upper top of the component and a ceiling part of the metallic chamber, through which gap an inert gas supplied from the upper part of the metallic chamber can be branched into inert gas flow flowing down inside the component and inert gas flow flowing down outside the component.

2. A device for producing a single crystal according to claim 1, wherein a supporting means of the heat resistant and heat insulating component is arranged on the ceiling part of the metallic chamber and the gap between the upper top of the heat resistant and heat insulating component and the ceiling part of the metallic chamber is adjustable structurally.

3. A device for producing a single crystal according to claim 1 or claim 2, wherein the gap between the upper top of the heat resistant and heat insulating component and the ceiling part of the metallic chamber is 5 mm to 100 mm.

4. A device for producing a single crystal according to claim 1 or claim 2 wherein the heat resistant and heat insulating component is made of graphite and the surface thereof is coated with silicon carbide.

* * * * *